(12) United States Patent
Kanai et al.

(10) Patent No.: US 6,377,135 B1
(45) Date of Patent: Apr. 23, 2002

(54) PIEZOELECTRIC RESONATOR AND PIEZOELECTRIC RESONANT ELEMENT

(75) Inventors: Shungo Kanai, Toyama; Masao Gamo, Takaoka, both of (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/648,526

(22) Filed: Aug. 26, 2000

(30) Foreign Application Priority Data

Aug. 27, 1999 (JP) .......................................... 11-241381

(51) Int. Cl.⁷ ......................... H03H 9/17; H03H 9/205; H03H 9/54; H03H 9/60
(52) U.S. Cl. ....................... 333/187; 333/189; 310/321; 310/366
(58) Field of Search ................................ 333/186–192; 310/320, 321, 357, 366

(56) References Cited

U.S. PATENT DOCUMENTS

| | | | | |
|---|---|---|---|---|
| 4,045,753 A | * | 8/1977 | Arakawa | ..................... 333/191 |
| 4,464,599 A | * | 8/1984 | Briese | ........................ 310/348 |
| 5,446,335 A | * | 8/1995 | Hino | ............................ 310/359 |
| 5,898,348 A | * | 4/1999 | Ikeda | ......................... 333/191 |
| 6,002,308 A | * | 12/1999 | Gamo | .................... 333/189 X |
| 6,011,451 A | * | 1/2000 | Gamo | ........................ 333/189 |

FOREIGN PATENT DOCUMENTS

| | | | | |
|---|---|---|---|---|
| JP | 6-6175 | * | 1/1994 | ................. 333/191 |
| JP | 10-284985 | | 10/1998 | |
| JP | 11-168344 | * | 6/1999 | |

* cited by examiner

*Primary Examiner*—Robert Pascal
*Assistant Examiner*—Barbara Summons
(74) *Attorney, Agent, or Firm*—Keating & Bennett, LLP

(57) ABSTRACT

First resonant electrodes are provided on one main surface of a piezoelectric plate, a second resonant electrode is provided on the other main surface of the piezoelectric plate, such that the first and second resonant electrodes face each other. An energy trap-type piezoelectric vibrating section is thus provided by the first and second resonant electrodes, and a capacitor section is provided in a position separated from the vibrating section. The capacitor section has a first capacitor electrode provided on the upper surface of the piezoelectric plate, and has a second capacitor electrode provided on the bottom surface of the piezoelectric plate. Further, an outer edge portion of the first capacitor electrode is spaced from an outside edge of the piezoelectric plate, thus providing a margin area except at the portions led out to the outside edge of the piezoelectric plate.

21 Claims, 8 Drawing Sheets

PIEZOELECTRIC RESONATOR AND PIEZOELECTRIC RESONANT ELEMENT

BACKGROUND OF THE INVENTION

1. Field of the Invention

The present invention relates to an energy trap-type piezoelectric resonator. More specifically, this invention relates to a piezoelectric resonator having an energy trap-type piezoelectric vibrating section and a capacitor including a pair of mutually opposed capacitor electrodes. Further, the invention also relates to a chip-type piezoelectric resonant element formed by using such piezoelectric resonators.

2. Description of the Related Art

Conventionally, in an intermediate frequency band of a mobile communication device such as an FM receiver and a portable telephone, a piezoelectric filter has generally been used as a frequency band filter.

Japanese Unexamined Patent Application Publication No. 10-284985 discloses one example of the above described piezoelectric filter. In the following, such a kind of a conventional piezoelectric filter will be described in detail with reference to FIG. 7 and FIG. 8.

Figure 7:
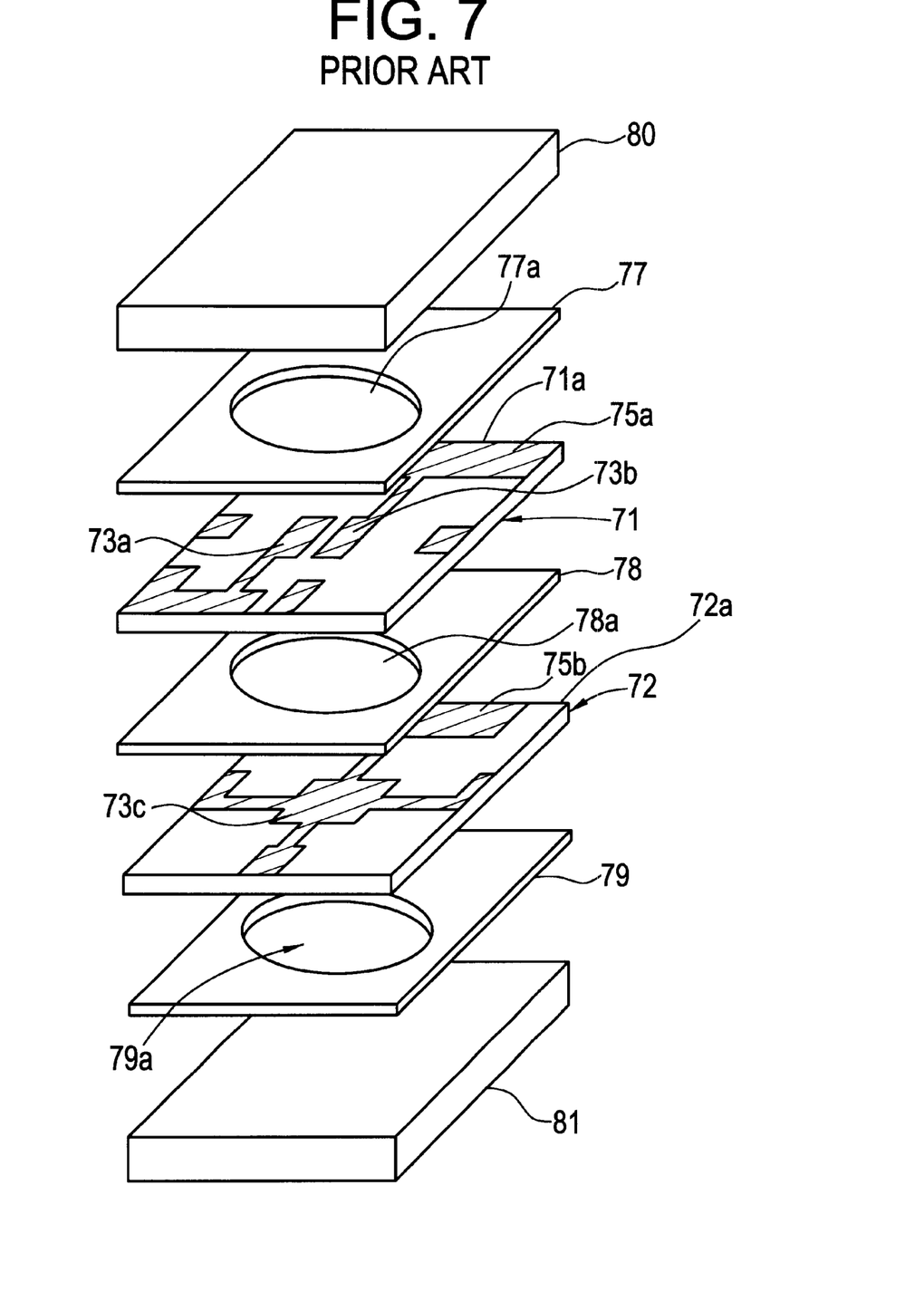
FIG. 7 is an exploded perspective view illustrating an example of a conventional piezoelectric filter.

As shown in FIG. 7, the conventional piezoelectric filter is constructed by using a first piezoelectric substrate plate 71 and a second piezoelectric substrate plate 72. On the upper surface of the first piezoelectric substrate plate 71, resonant electrodes 73a and 73b are provided. Further, on the underside surface of the first piezoelectric substrate plate 71, another resonant electrode serving as a common electrode is provided in a position opposite the above electrodes 73a and 73b. By virtue of the resonant electrodes provided on these main surfaces of the substrate plates, an energy trap-type piezoelectric vibrating section is provided which functions in a thickness-extension oscillation mode.

Further, a capacitor electrode 75a is connected with the resonant electrode 73b. Particularly, the capacitor electrode 75a is provided along an edge 71a of the piezoelectric substrate plate 71.

Moreover, a resonant electrode 73c serving as a common electrode is provided on the upper surface of the second piezoelectric substrate plate 72. In addition, the resonant electrode 73c is electrically connected with a capacitor electrode 75b. Similarly, the capacitor electrode 75b is provided along an edge 72a of the piezoelectric substrate plate 72. Here, the piezoelectric substrate plate 71 and the piezoelectric substrate plate 72 have the same structure. Namely, on the bottom surface of the piezoelectric substrate plate 71 an electrode structure is provided which is the same as the electrode structure provided on the upper surface of the piezoelectric substrate plate 72. In contrast, on the bottom surface of the piezoelectric substrate 72 an electrode structure is provided which is the same at the electrode structure provided on the upper surface of the piezoelectric substrate plate 71. Therefore, with respect to the same electrodes, the same reference numerals are used to represent similar elements on the two piezoelectric substrate plates 71 and 72.

With such a piezoelectric filter, the first piezoelectric substrate plate 71 and the second piezoelectric substrate plate 72 are laminated one above the other such that the resonant electrodes 73c serving as the common electrodes face each other. Here, spacers 77 to 79 are provided having circular holes 77a to 79a, respectively, provided such that the oscillation of the piezoelectric oscillating section is not suppressed. Further, sealing substrate plates 80 and 81 are provided.

Figure 8:
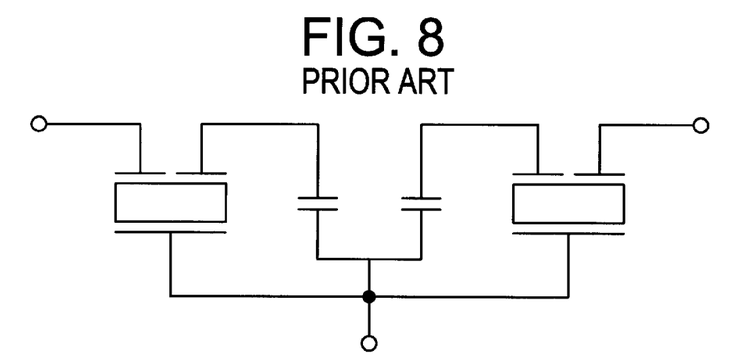
FIG. 8 is an explanatory view illustrating a circuit formed by the piezoelectric filter shown in FIG. 7.

Moreover, in the above described piezoelectric filter a circuit configuration shown in FIG. 8 is employed. Namely, the first and second piezoelectric substrate plates 71 and 72 of the piezoelectric filter section are electrically connected by relay capacitors. Such relay capacitors are provided on the piezoelectric substrate plates 71 and 72 by an electrostatic capacitance existing between the capacitor electrodes 75a and 75b.

Furthermore, in the above described piezoelectric filter, the circuit configuration shown in FIG. 8 has been employed, but the piezoelectric filter section has been divided into first and second piezoelectric filter sections in the first piezoelectric substrate plate 71 and the second piezoelectric substrate plate 72, respectively. Since the first piezoelectric substrate plate 71 and the second piezoelectric substrate plate 72 are laminated one above the other, the actual mounting area is reduced.

Figure 9:
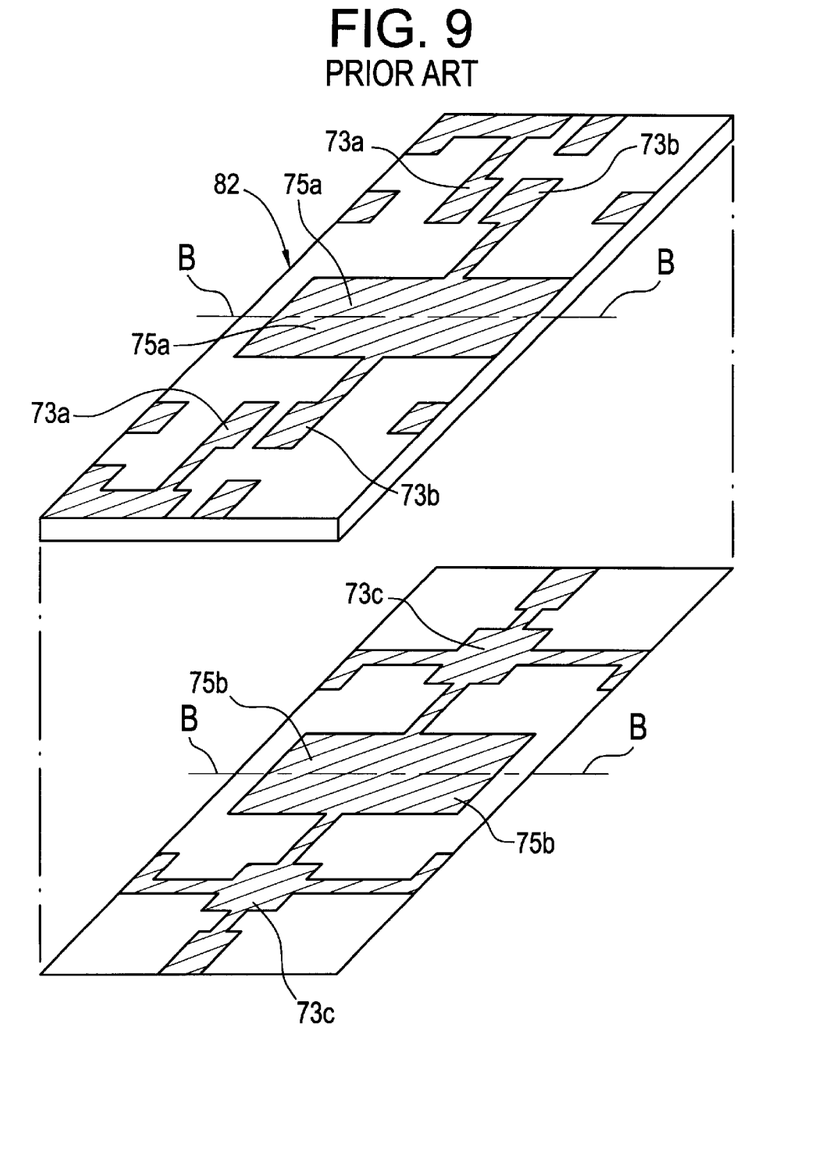
FIG. 9 is a perspective view illustrating a mother piezoelectric substrate plate for use in forming piezoelectric substrate plates of the piezoelectric filter shown in FIG. 7.

However, to obtain the first piezoelectric substrate plate 71 and the second piezoelectric substrate plate 72 described above, a piezoelectric substrate plate 82 shown in FIG. 9 must be prepared in the conventional art. By dividing the piezoelectric substrate plate 82, the first piezoelectric substrate plate 71 and the second piezoelectric substrate plate 72 are obtained.

However, during an actual manufacturing process, in order to ensure improved productivity, a mother piezoelectric substrate plate including several pieces of the piezoelectric substrate plates 82 arranged in parallel with the main surface of each substrate plate has been used.

By dividing the piezoelectric substrate plate 82 along dotted chain lines B—B in FIG. 9, the first and the second piezoelectric substrate plates 71 and 72 are obtained. At this time, the capacitor electrodes 75a and 75b of the piezoelectric substrate plates 71 and 72 are thus formed through such a cutting process.

On the other hand, when the above cutting position deviates from its correct position, the capacitor electrode 75a provided on one piezoelectric substrate plate 71 will be different in size from the capacitor electrode 75b provided on the other piezoelectric substrate plate 72 in a direction orthogonal to the cutting line.

Therefore, in order to divide the piezoelectric substrate plate 82 into two portions, it is necessary that the piezoelectric substrate plate 82 be very precisely divided.

However, in practice, the cutting of the piezoelectric substrate plate 82 into two portions with high precision is difficult, and often impossible to avoid differences in the size between the two capacitor electrodes 75a and 75b provided on the piezoelectric substrate plates 71 and 72.

For the above reason, if a piezoelectric filter is produced having the above described structure, the filter characteristics of one piezoelectric filter will be different from those of another.

SUMMARY OF THE INVENTION

In order to overcome the problems described above, preferred embodiments of the present invention provide an improved piezoelectric resonator including an energy trap-type piezoelectric vibrating section and a capacitor section provided by two capacitor electrodes arranged to face each other with a piezoelectric plate interposed therebetween. In particular, preferred embodiments of the present invention provide an improved piezoelectric resonator which ensures that the capacitance of a capacitor section does not differ from one piezoelectric resonator to another, so as to produce desired resonance characteristics and desired filter characteristics with high precision. Further, preferred embodiments of the present invention provide a piezoelectric filter.

According to preferred embodiments of the present invention, an energy trap-type piezoelectric resonator is provided which includes a piezoelectric substrate plate having a first main surface and a second main surface, first and second resonant electrodes provided on the first and second main surfaces of the piezoelectric substrate plate, respectively, to form an energy trap-type piezoelectric vibrating section, and first and second capacitor electrodes provided on the first and second main surfaces of the piezoelectric substrate plate, respectively, and arranged one above the other with the piezoelectric substrate plate interposed therebetween. In particular, the first and the second capacitor electrodes extend along the first and the second main surfaces to the edges thereof. Further, the first capacitor electrode is spaced by a desired margin area from an adjacent outside edge of the piezoelectric substrate plate, except at lead portions led out to said adjacent outside edge.

Preferably, the first capacitor electrode is spaced from the adjacent outside edge of the piezoelectric substrate plate such that the distances between the outer edge of the first capacitor electrode itself and an outer edge of the second capacitor electrode, in a direction in which the first capacitor electrode is spaced, are at least equal to the thickness of the piezoelectric substrate plate.

Preferably, the piezoelectric resonator is an energy trap-type piezoelectric filter, the first resonant electrode includes a pair of resonant electrode members provided on the first main surface of the piezoelectric substrate plate, with a desired gap provided between the pair of electrode members, the second resonant electrode is a common electrode which is provided on the second main surface of the piezoelectric substrate plate such that said second resonant electrode is located opposite the first resonant electrode provided on the first main surface of the substrate plate, and the first and the second capacitor electrodes are electrically connected to the first or the second resonant electrodes, respectively.

It is preferable that the two piezoelectric resonators forming the above piezoelectric filter are laminated one above the other such that vibrations of both piezoelectric vibrating sections of the two resonators are not suppressed and that the common electrodes face each other.

Preferably, the region of said piezoelectric substrate plate where the first and the second capacitor electrodes face each other is non-polarized.

According to another preferred embodiment of the invention, a chip-like piezoelectric resonant element is provided which includes a piezoelectric resonator as described above, and first and second case substrate plates each having a recess portion which is provided such that the vibration of the piezoelectric resonator is not suppressed, said first and second case substrate plates being arranged one above the other with the piezoelectric resonator interposed therebetween.

DETAILED DESCRIPTION OF PREFERRED EMBODIMENTS

Preferred embodiments of the present invention will be described, with reference to the accompanying drawings.

Figure 1:
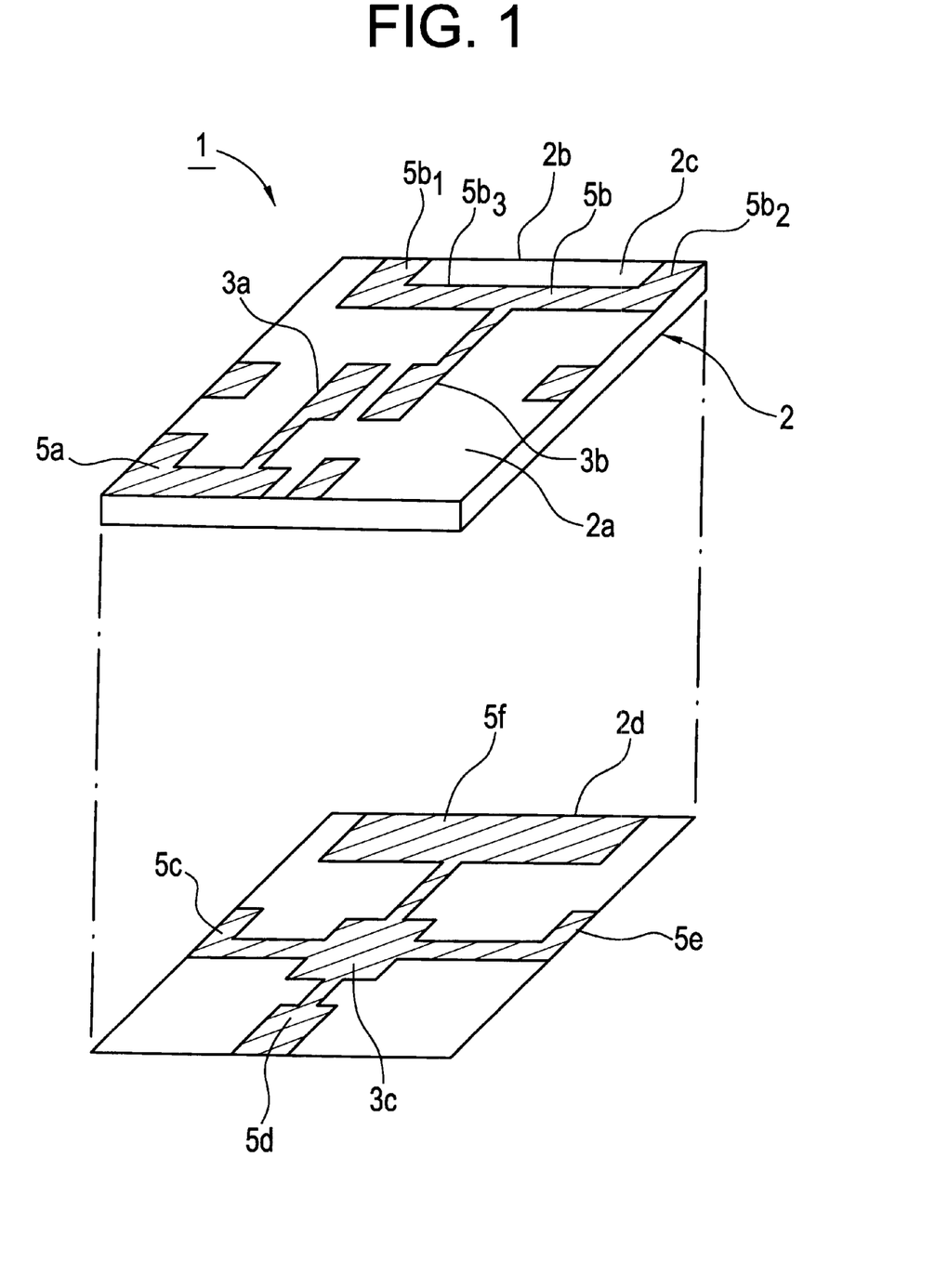
FIG. 1 is a perspective view illustrating a piezoelectric resonator according to a first preferred embodiment of the present invention.

FIG. 1 is a perspective view illustrating a piezoelectric resonator made according to one preferred embodiment of the present invention.

As shown in the drawing, the piezoelectric resonator 1 is an energy trap-type piezoelectric resonator which functions by virtue of a thickness-extension vibration mode. The piezoelectric resonator 1 has a rectangular piezoelectric plate 2. The piezoelectric plate 2 is made of a piezoelectric ceramic such as a lead titanate zirconate ceramic, or other suitable piezoelectric ceramic, or a piezoelectric single crystal such as a quartz crystal and $LiTaO_3$, or other suitable piezoelectric single crystal. When the energy trap-type piezoelectric resonator 1 is made of a piezoelectric ceramic, a polarization treatment is applied in the thickness direction, in the same manner throughout the entire resonator body.

On the center of the upper surface 2a of the piezoelectric plate 2, a pair of first resonant electrodes 3a and 3b is provided which are arranged with a predetermined gap provided therebetween so that they face each other. On the bottom surface of the piezoelectric plate 2, a second resonant electrode 3c serving as a common electrode is provided such that it is opposite the resonant electrodes 3a and 3b with the piezoelectric plate 2 interposed therebetween.

On the upper surface 2a of the piezoelectric plate 2, the resonant electrode 3a is electrically connected with a lead electrode 5a provided on the corner of the plate 2. The resonant electrode 3b is electrically connected with a first capacitor electrode 5b. The first capacitor electrode 5b is provided on the upper surface 2a of the piezoelectric plate 2 and includes a pair of lead portions $5b_1$ and $5b_2$ connected with an outside edge 2b. Except at lead portions $5b_1$ and $5b_2$, the first capacitor electrode 5b is spaced from the outside edge 2b by a margin area 2c. Hereinafter, the spaced amount of the first capacitor electrode 5b, i.e. a distance between an outer edge $5b_3$ (exclusive of lead portions $5b_1$ and $5b_2$) of the capacitor electrode 5b and the outside edge 2b is referred to as a spacing distance R.

On the bottom surface of the piezoelectric plate 2, the second resonant electrode 3c which is connected with lead electrodes 5c, 5d and 5e is provided. Further, the second resonant electrode 3c is also connected with a second capacitor electrode 5f. The second capacitor electrode 5f is provided along an outside edge 2d located under the outside edge 2b of the piezoelectric plate 2. Corresponding to the area where the first and second capacitor electrodes 5b and 5f are provided, the piezoelectric plate 2 is partially treated to be a non-polarized portion. Further, a capacitor is provided between the first and second capacitor electrodes 5b and 5f.

In the piezoelectric resonator 1 made according to preferred embodiments of the present embodiment, the electrostatic capacitance of the capacity existing between the first and second capacitor electrodes 5b and 5f will not substantially differ from one resonator to another. This fact will be made more understandable by describing a manufacturing method with reference to FIG. 2.

Figure 2:
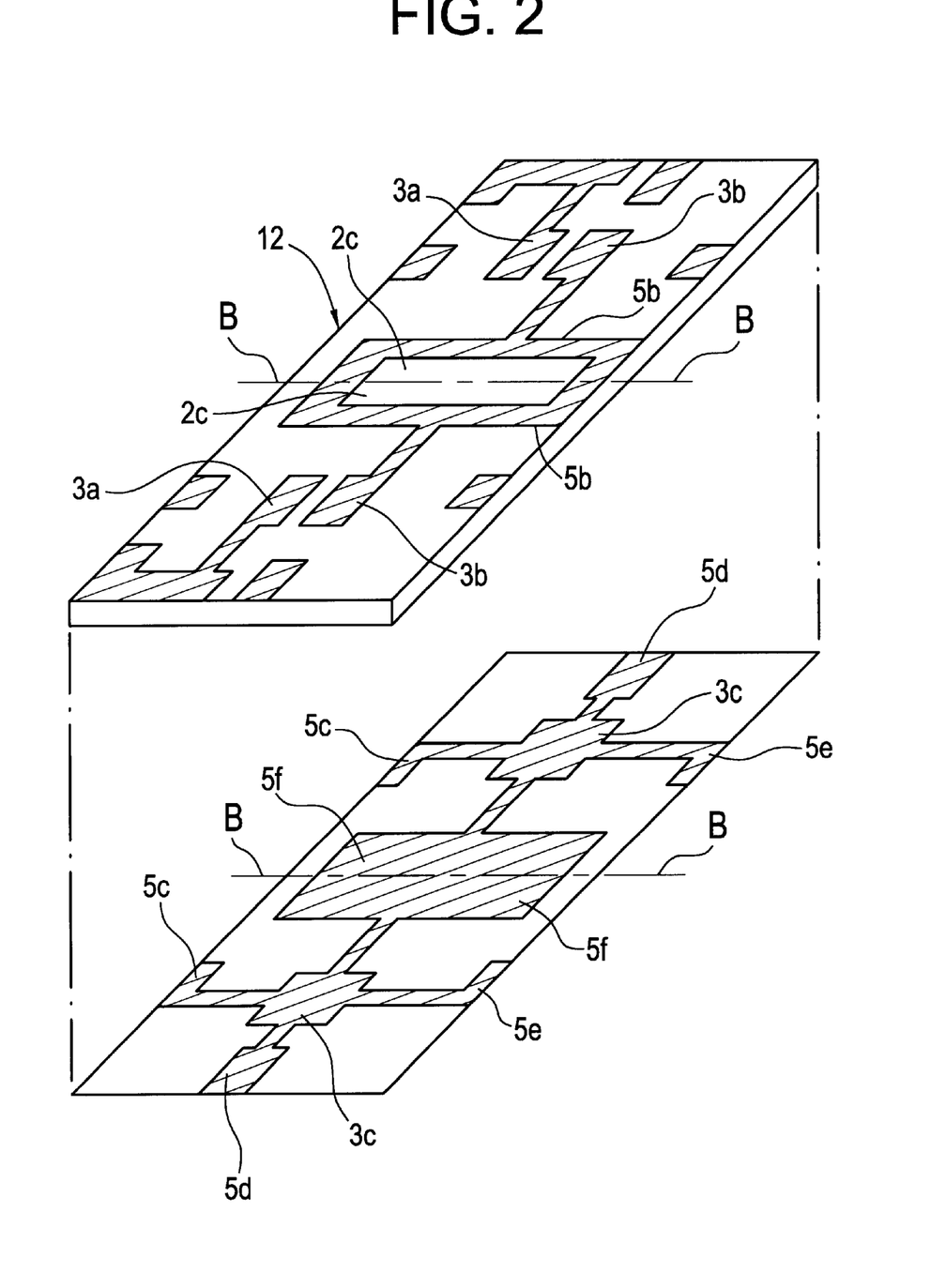
FIG. 2 is a perspective view illustrating a mother piezoelectric substrate plate for use in producing the piezoelectric resonator shown in FIG. 1.

When the piezoelectric resonator 1 is to be manufactured, a mother piezoelectric substrate plate 12 shown in FIG. 2 is prepared. Such a mother piezoelectric substrate plate 12 is substantially equivalent to a structure formed by connecting together two piezoelectric resonators 1 with their margin areas 2c facing and contacting each other. However, the mother piezoelectric substrate plate 12 may also be formed by connecting together two piezoelectric resonators 1, but with said connecting direction being orthogonal to a direction in which the two margin areas 2c are connected with each other in a manner shown in the drawing.

Further, extending on the upper surface and the bottom surface of the mother piezoelectric substrate plate 12, are provided electrode structures each including two electrodes located on the upper surface and the bottom surface of the piezoelectric resonator 1. In FIG. 2, those elements which are the same as those shown in FIG. 1 will be represented by the same reference numerals, and a detailed description of each electrode structure will be omitted herefrom by making use of the descriptions made for explaining the elements shown in FIG. 1.

By cutting the mother piezoelectric substrate plate 12 along dotted chain lines B—B, two of the piezoelectric resonators shown in FIG. 1 are produced. At this time, the two mutually adjacent piezoelectric resonators 1 and 1 are connected together with their margin areas 2c facing and being connected to each other. For this reason, even if the cutting line represented by the dotted chain line B—B deviates towards either of the piezoelectric resonators, the surface area of each resonator except at their lead portions $5b_1$ and $5b_2$ of the first capacitor electrodes is not changed. Therefore, in a plurality of piezoelectric resonators 1 obtained by cutting each mother piezoelectric substrate plate 12 into two portions, the capacitance of the capacitor section of one resonator does not differ from that of another.

On the bottom surface of the mother piezoelectric substrate plate 12, the two second capacitor electrodes 5f are connected with each other and in contact with one another back-to-back. As a result, a deviation in the position of a cutting line will cause the areas of the second capacitor electrodes 5f to differ in the two piezoelectric resonators 1 and 1. However, because the electrostatic capacitance of the capacitor of each piezoelectric resonator 1 depends on the two mutually facing areas of the first and second capacitor electrodes 5b and 5f, even if the cutting line deviates from its correct position, the electrostatic capacitance obtained in the above manner will not differ from one resonator to another.

The features of the piezoelectric resonator 1 made according to preferred embodiments of the present invention may be summarized as follows. Among the first and second capacitor electrodes 5b and 5f which are arranged to face each other with the piezoelectric plate 2 interposed therebetween, a margin area 2c is provided for the first capacitor electrode 5b except at the lead portions $5b_1$ and $5b_2$, thereby substantially reducing variations in electrostatic capacitance, which would otherwise be caused by deviations in cutting position for cutting the mother piezoelectric substrate plate 12.

Figure 3:
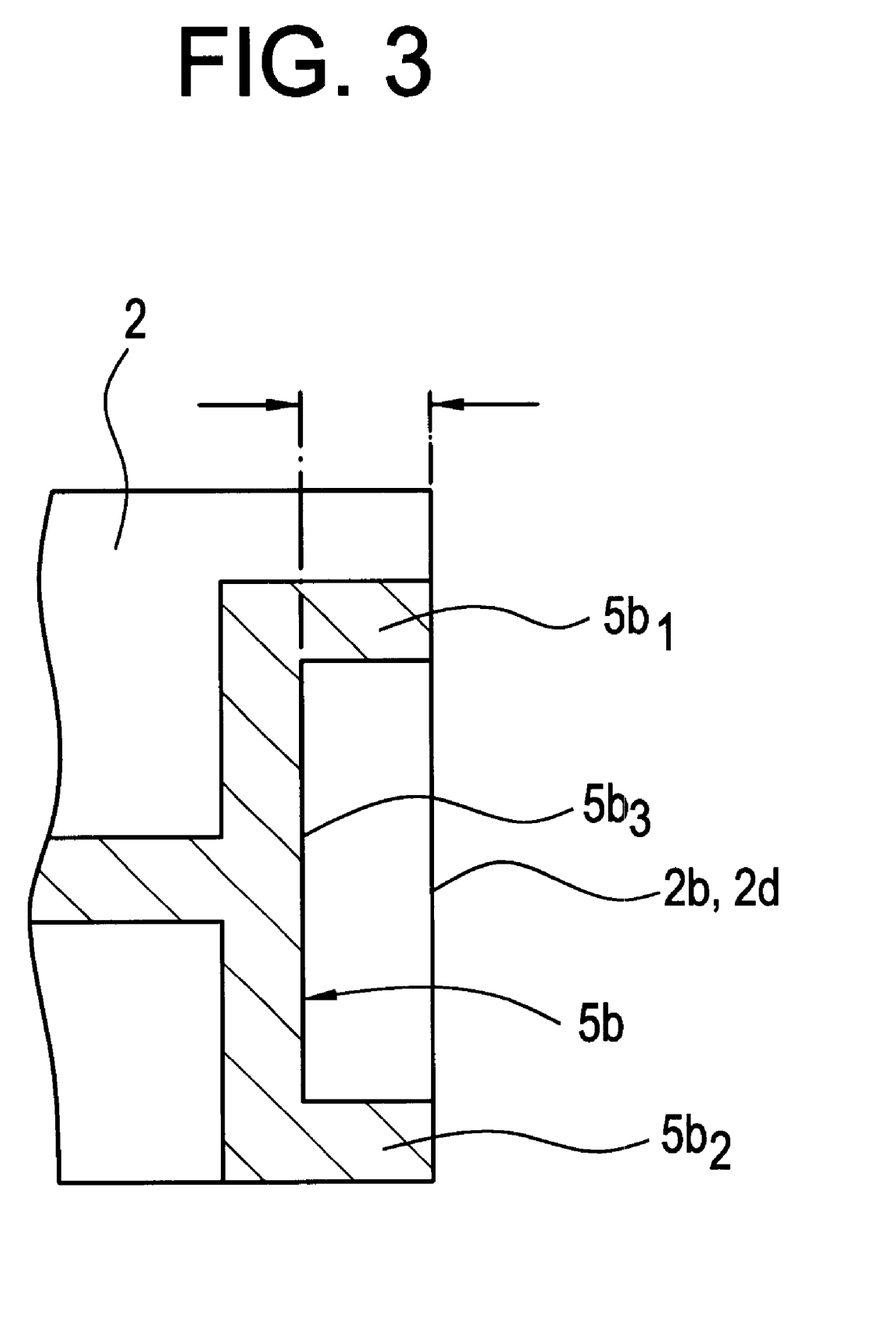
FIG. 3 is a partially enlarged plan view illustrating a distance between an outer edge of a first capacitor electrode and an outside edge of a piezoelectric plate, concerning a piezoelectric resonator made according to a preferred embodiment of the present invention.

As shown in FIG. 3 which is an enlarged plan view indicating a notched portion, preferably the distance between the outside edge 2b of the piezoelectric plate 2 and the outer edge $5b_3$ of the first capacitor electrode 5b (except at lead portions $5b_1$, $5b_2$) is at least equal to the thickness of the piezoelectric plate 2, and that the distance between the outside edge 2b of the piezoelectric plate 2 and an outside edge of the second capacitor electrode 5f (in the present preferred embodiment, the outer edge 2d of the piezoelectric plate 2) is also at least equal to that of the piezoelectric plate 2. In this way, when the above thickness distance is set to be at least equal to the thickness of the piezoelectric plate 2, even if there are some variations in the manufacturing process, variations in the electrostatic capacitance are restricted to a value of 10% or less.

In the following, a chip-like piezoelectric filter made with the piezoelectric resonator made according to the preferred embodiments of the present embodiment will be described with reference to FIGS. 4 to 6C.

Figure 4:
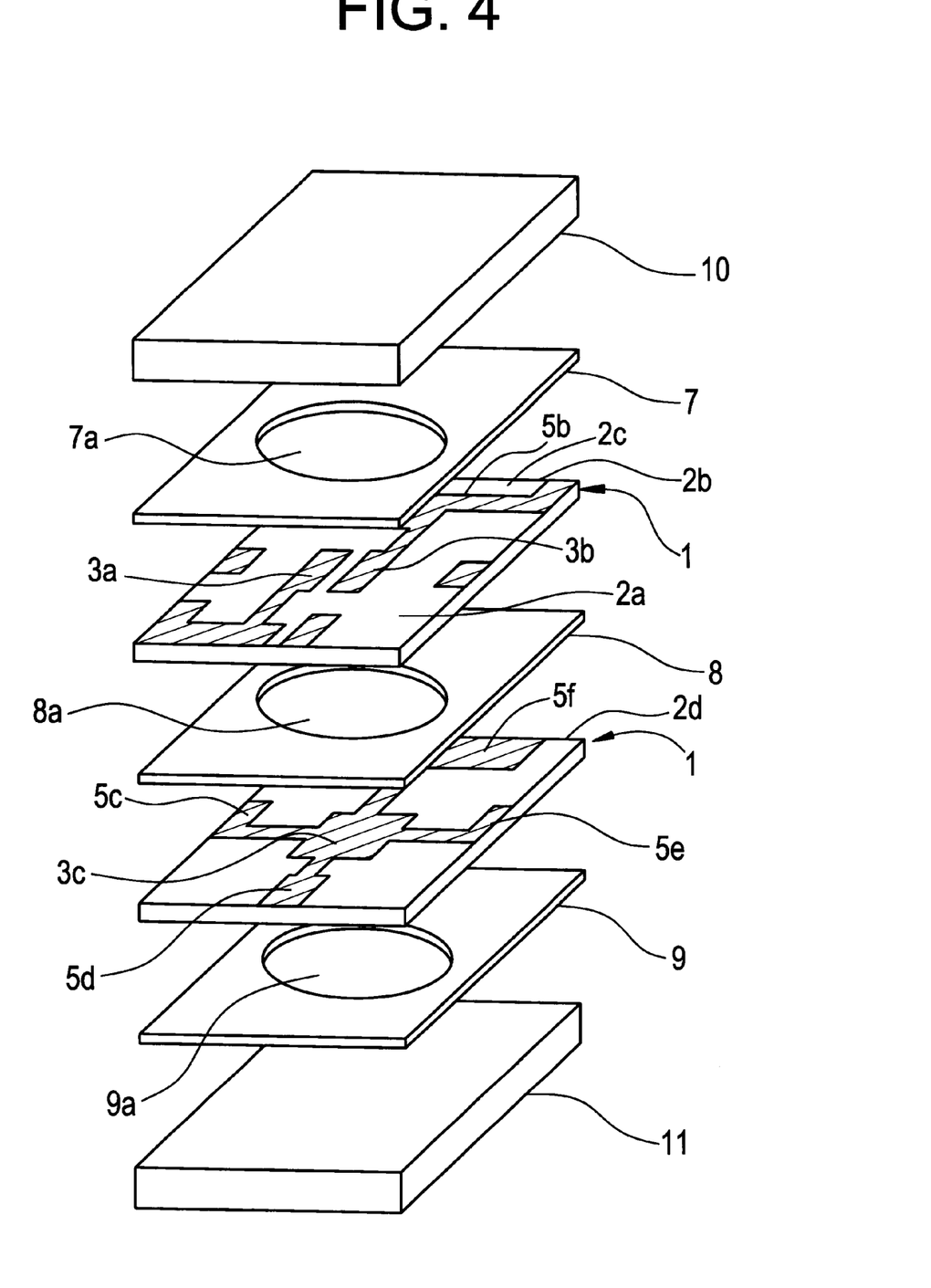
FIG. 4 is an exploded perspective view illustrating a chip-like piezoelectric filter formed by using the piezoelectric resonator made according to a preferred embodiment of the present invention.

The piezoelectric filter of the present preferred embodiment is configured into a chip-like piezoelectric resonant element. Further, in the present preferred embodiment, two layers of the piezoelectric resonator 1 shown in FIG. 1 are laminated together. Namely, first and second piezoelectric resonators 1 and 1 are laminated one above the other such that the two resonant electrodes 3c serving as a common electrode face each other. Further, between the first and second piezoelectric resonators 1 and 1, a spacer 8 is provided which has a circular hole 8a provided in approximately the center thereof such that vibration of the piezoelectric vibrating section is not suppressed. Moreover, outside of both the first and second piezoelectric resonators 1 and 1, a pair of spacers 7 and 9, and a pair of case substrate plates 10 and 11 are provided. Similarly, the spacers 7 and 9 are provided with circular holes 7a and 9a such that vibration of the piezoelectric vibrating section is not suppressed.

Here, the spacers 7 to 9 may be made of an adhesive film. Alternatively, the spacers 7 to 9 may be made of a resin film and an electrically insulating adhesive is used to bond the piezoelectric resonators 1 and 1 and the case substrate plates 10 and 11 at predetermined positions.

On the other hand, if a recessed portion is provided on the inner surface of each of the case substrate plates 10 and 11 such that the desired vibration is not suppressed, the spacers 7 and 9 may be omitted.

Figure 5A:
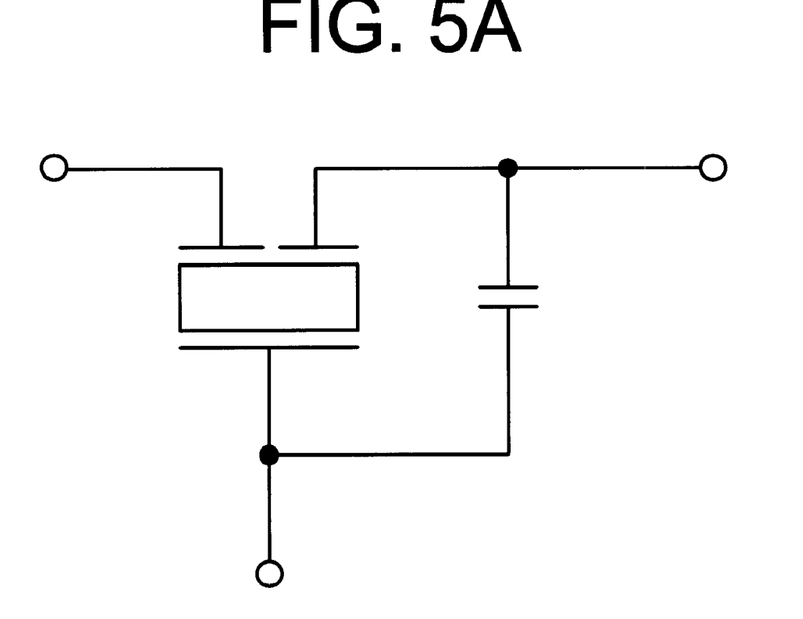
FIGS. 5A and 5B are explanatory views illustrating circuit structure provided in two piezoelectric resonators in the chip-like piezoelectric filter shown in FIG. 4.
Figure 5B:
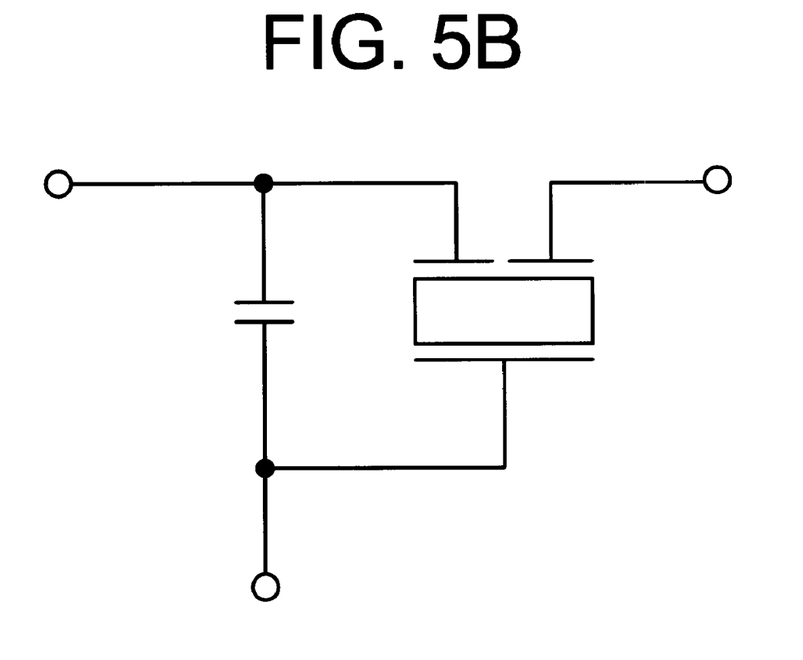
Figure 6A:
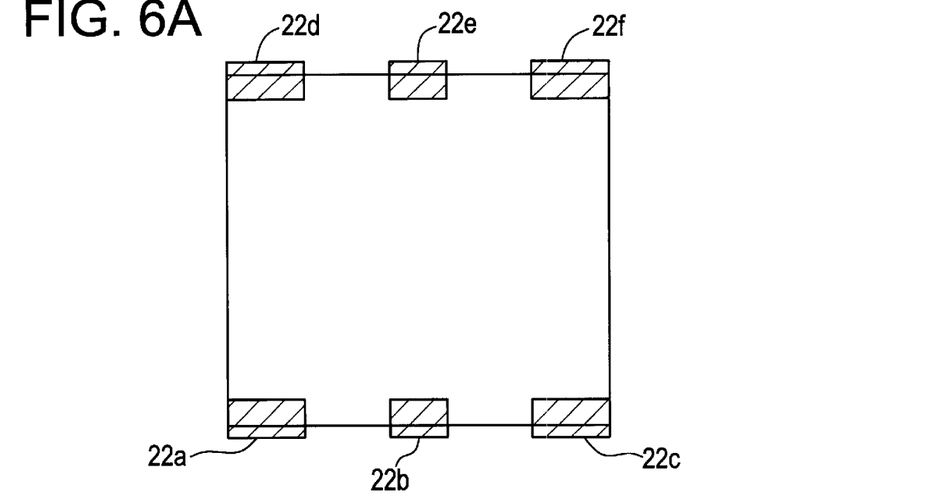
FIGS. 6A to 6C are, respectively, a plan view, a front view and a bottom view illustrating the outer appearance of the chip-like piezoelectric filter shown in FIG. 4.
Figure 6B:
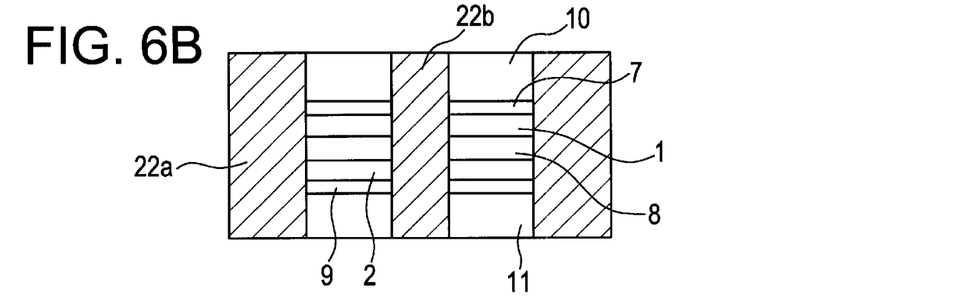
Figure 6C:
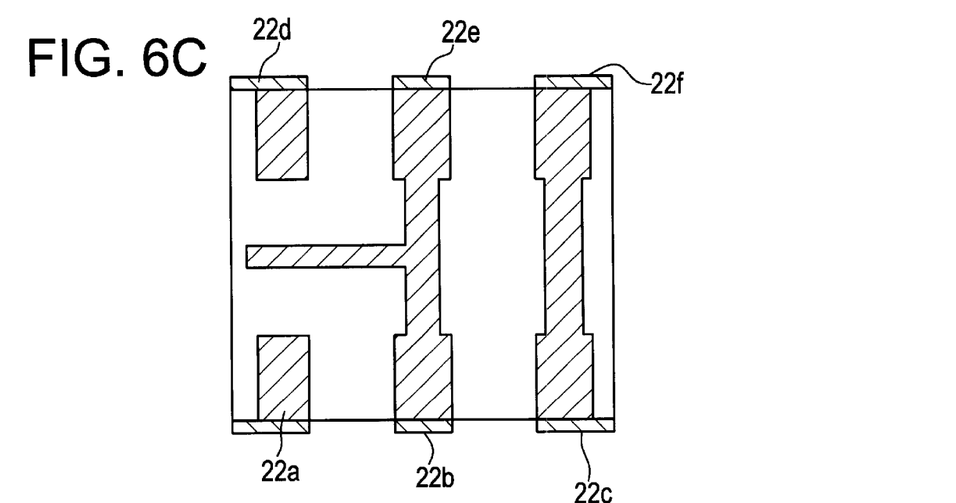

Moreover, in the piezoelectric filter made according to preferred embodiments of the present embodiment, the first and the second piezoelectric resonators 1 and 1 are formed into circuits as shown in FIG. 5A and FIG. 5B. Accordingly, as shown in FIGS. 6A to 6C, where a plurality of external electrodes 22a to 22f are provided on the outer surfaces of the resonators, the first and the second piezoelectric resonators 1 and 1 are electrically connected together so as to form the circuit shown in FIG. 8.

It has been described in the above preferred embodiment that two layers of piezoelectric resonators 1 and 1 are laminated one above the other and that a piezoelectric filter including two piezoelectric filter sections is formed by way of relay capacitors in the manner shown in FIG. 8. However, the present invention is not limited to such a specific embodiment. In fact, the present invention may also be suitably used to form a capacitive self-contained piezoelectric oscillator.

In the piezoelectric resonator made according to preferred embodiments of the present invention, a capacitor section is provided which has an energy trap-type piezoelectric vibrating section and first and second capacitor electrodes. The first capacitor electrode is configured such that it is spaced from an outside edge of the piezoelectric plate, thus providing a margin area except at the lead portions led out to the outside edge of the piezoelectric plate. In this way, when other electrodes are provided on the mother piezoelectric substrate plate and when the mother piezoelectric substrate plate is cut along a portion where the first capacitor electrode is connected, even if there is a deviation in the cutting position, the electrostatic capacitance obtained between the first and the second capacitor electrodes will not be substantially altered. Therefore, it is possible to manufacture improved piezoelectric resonators whose capacitance does not substantially differ from one to another.

In particular, when the distance between the outer edge of the spaced portion of the first capacitor electrode spaced from the outside edge of the piezoelectric substrate plate and an outside edge of the second capacitor electrode is set to be at least equal to the thickness of the piezoelectric substrate plate, variations in the electrostatic capacitance are maintained within a desired range.

Further, in the piezoelectric resonator made according to preferred embodiments of the present invention, the first resonant electrodes include a pair of resonant electrode members which are provided on the first main surface of the piezoelectric substrate plate with a desired gap provided between the pair of electrode members. The second resonant electrode is a common electrode which is provided on the second main surface of the piezoelectric substrate plate such that said second resonant electrode is located opposite to the first resonant electrodes provided on the first main surface of the substrate plate. When the first and the second capacitor electrodes are electrically connected to the first and the second resonant electrodes, a piezoelectric filter structure having one piezoelectric filter section and one capacitor section is provided. In this way, by preparing two such piezoelectric filters and having two capacitor sections electrically connected together, a piezoelectric filter device in which two piezoelectric filter sections are connected to one another by way of relay capacitors is produced.

Moreover, in the present invention, when the piezoelectric substrate plate is not polarized in an area where the first and the second capacitor electrodes are opposed to one another, an undesired piezoelectric vibration prevented from occurring in the capacitor section including the above first and second capacitor electrodes, so that a piezoelectric resonator having good resonant characteristics is provided.

In addition, when the two piezoelectric resonators are laminated one above the other such that the vibrations of the two vibrating sections are not suppressed and that the two common electrodes are face each other, connecting the common electrodes to the ground potential enables a piezoelectric resonator having good filter characteristics to be produced.

Finally, the chip-like piezoelectric resonant element made according to the present invention, includes the piezoelectric resonators of the present invention, first and second case substrate plates each having a recess portion provided such that the vibration of the piezoelectric resonators is not suppressed, said first and second case substrate plates being arranged one above the other, with the piezoelectric resonators interposed therebetween. Therefore, multiple chip-like piezoelectric elements whose capacitances do not differ substantially from one another are produced.

What is claimed is:

1. An energy trap-type piezoelectric resonator comprising:
   a piezoelectric substrate plate having a first main surface and a second main surface;
   first and second resonant electrodes provided on the first and second main surfaces of the piezoelectric substrate plate, respectively, to form an energy trap-type piezoelectric vibrating section; and
   first and second capacitor electrodes provided on the first and second main surfaces of the piezoelectric substrate plate, respectively, said first and second capacitor electrodes being arranged one above the other with the piezoelectric substrate plate interposed therebetween; wherein
   the first and the second capacitor electrodes are configured to extend on the first and the second main surfaces to edges thereof; and
   the first capacitor electrode is provided to be spaced by a desired margin area from an adjacent outside edge of the piezoelectric substrate plate, except at lead portions of said first capacitor electrode led out to said adjacent outside edge.

2. A chip-like piezoelectric resonant element, comprising:
   a piezoelectric resonator according to claim 1; and
   first and second case substrate plates each having a recessed portion provided such that the vibration of the piezoelectric resonator is not suppressed, said first and second case substrate plates being arranged one above the other with the piezoelectric resonator interposed therebetween.

3. The piezoelectric resonator according to claim 1, wherein said piezoelectric resonator is an energy trap-type piezoelectric filter, the first resonant electrode includes a pair of resonant electrode members provided on the first main surface of the piezoelectric substrate plate, with a desired gap provided between the pair of electrode members;
   the second resonant electrode is a common electrode provided on the second main surface of the piezoelectric substrate plate such that said second resonant electrode is located opposite to the first resonant electrode provided on the first main surface of the substrate plate, and the first and the second capacitor electrodes are electrically connected to the first and the second resonant electrodes, respectively.

4. The piezoelectric resonator according to claim 3, wherein the region of said piezoelectric substrate plate where the first and the second capacitor electrodes face each other is non-polarized.

5. A chip-like piezoelectric resonant element, comprising:
   a piezoelectric resonator according to claim 4; and
   first and second case substrate plates each having a recessed portion provided such that the vibration of the piezoelectric resonator is not suppressed, said first and second case substrate plates being arranged one above the other with the piezoelectric resonator interposed therebetween.

6. A piezoelectric resonator comprising two of the piezoelectric resonators according to claim 3 laminated one above the other in a manner such that vibrations of both piezoelectric vibrating sections of the two resonators are not suppressed and that the common electrodes thereof face each other.

7. A chip-like piezoelectric resonant element, comprising:

a piezoelectric resonator according to claim 3; and first and second case substrate plates each having a recessed portion provided such that the vibration of the piezoelectric resonator is not suppressed, said first and second case substrate plates being arranged one above the other with the piezoelectric resonator interposed therebetween.

8. The piezoelectric resonator according to claim 1, wherein said piezoelectric substrate plate is composed of a piezoelectric ceramic.

9. The piezoelectric resonator according to claim 8, wherein said piezoelectric ceramic is a lead titanate zirconate ceramic.

10. The piezoelectric resonator according to claim 1, wherein said piezoelectric substrate plate is composed of a piezoelectric single crystal.

11. The piezoelectric resonator according to claim 10, herein said piezoelectric single crystal is a quartz crystal and $LiTaO_3$.

12. The piezoelectric resonator according to claim 1, wherein the region of said piezoelectric substrate plate where the first and the second capacitor electrodes face each other is non-polarized.

13. A chip-like piezoelectric resonant element, comprising:

a piezoelectric resonator according to claim 12; and first and second case substrate plates each having a recessed portion provided such that the vibration of the piezoelectric resonator is not suppressed, said first and second case substrate plates being arranged one above the other with the piezoelectric resonator interposed therebetween.

14. The piezoelectric resonator according to claim 1, wherein the first capacitor electrode is spaced from the adjacent outside edge of the piezoelectric substrate plate such that the distances between an outer edge of the first capacitor electrode and an outer edge of the second capacitor electrode, in a direction in which the first capacitor electrode is spaced, are at least equal to the thickness of the piezoelectric substrate plate.

15. The piezoelectric resonator according to claim 14, wherein the region of said piezoelectric substrate plate where the first and the second capacitor electrodes face each other is non-polarized.

16. A chip-like piezoelectric resonant element, comprising:

a piezoelectric resonator according to claim 15; and first and second case substrate plates each having a recessed portion provided such that the vibration of the piezoelectric resonator is not suppressed, said first and second case substrate plates being arranged one above the other with the piezoelectric resonator interposed therebetween.

17. A chip-like piezoelectric resonant element, comprising:

a piezoelectric resonator according to claim 14; and first and second case substrate plates each having a recessed portion provided such that the vibration of the piezoelectric resonator is not suppressed, said first and second case substrate plates being arranged one above the other with the piezoelectric resonator interposed therebetween.

18. The piezoelectric resonator according to claim 14, wherein said piezoelectric resonator is an energy trap-type piezoelectric filter, the first resonant electrode includes a pair of resonant electrode members provided on the first main surface of the piezoelectric substrate plate, with a desired gap provided between the pair of electrode members;

the second resonant electrode is a common electrode provided on the second main surface of the piezoelectric substrate plate such that said second resonant electrode is a located opposite to the first resonant electrode provided on the first main surface of the substrate plate, and the first and the second capacitor electrodes are electrically connected to the first and the second resonant electrodes, respectively.

19. A chip-like piezoelectric resonant element, comprising:

a piezoelectric resonator according to claim 18; and first and second case substrate plates each having a recessed portion provided such that the vibration of the piezoelectric resonator is not suppressed, said first and second case substrate plates being arranged one above the other with the piezoelectric resonator interposed therebetween.

20. The piezoelectric resonator according to claim 18, wherein the region of said piezoelectric substrate plate where the first and the second capacitor electrodes face each other is non-polarized.

21. A piezoelectric resonator comprising two of the piezoelectric resonators according to claim 18 laminated one above the other such that vibrations of both piezoelectric vibrating sections of the two piezoelectric resonators are not suppressed and the common electrodes thereof face each other.

* * * * *